(12) United States Patent
Xie et al.

(10) Patent No.: US 11,846,686 B2
(45) Date of Patent: Dec. 19, 2023

(54) WIRELESS FLEXIBLE MAGNETIC SENSOR BASED ON MAGNETOTHERMAL EFFECT, AND PREPARATION METHOD AND DETECTION METHOD THEREOF

(71) Applicant: XI'AN JIAOTONG UNIVERSITY, Xi'an (CN)

(72) Inventors: Shejuan Xie, Xi'an (CN); Yue Li, Xi'an (CN); Panpan Xu, Xi'an (CN); Zhenmao Chen, Xi'an (CN); Jingda Tang, Xi'an (CN); Hang Yang, Xi'an (CN)

(73) Assignee: XI'AN JIAOTONG UNIVERSITY, Xi'an (CN)

( * ) Notice: Subject to any disclaimer, the term of this patent is extended or adjusted under 35 U.S.C. 154(b) by 0 days.

(21) Appl. No.: 17/640,523

(22) PCT Filed: Jan. 11, 2022

(86) PCT No.: PCT/CN2022/071287
§ 371 (c)(1),
(2) Date: Mar. 4, 2022

(87) PCT Pub. No.: WO2022/161157
PCT Pub. Date: Aug. 4, 2022

(65) Prior Publication Data
US 2023/0152394 A1 May 18, 2023

(30) Foreign Application Priority Data
Jan. 26, 2021 (CN) .......................... 202110101732.X

(51) Int. Cl.
*G01R 33/00* (2006.01)
*G01R 33/02* (2006.01)

(52) U.S. Cl.
CPC ......... *G01R 33/0052* (2013.01); *G01R 33/02* (2013.01)

(58) Field of Classification Search
None
See application file for complete search history.

(56) References Cited

U.S. PATENT DOCUMENTS

| 6,740,416 B1 * | 5/2004 | Yokogawa | ............. H10K 50/85 428/209 |
| 9,927,431 B2 * | 3/2018 | Wang | ..................... G01R 33/09 |

FOREIGN PATENT DOCUMENTS

| CN | 108896459 A | * 11/2018 | ............. G01N 15/06 |

OTHER PUBLICATIONS

English Translation of CN 108896459 (Year: 2018).*

* cited by examiner

*Primary Examiner* — Douglas X Rodriguez

(57) ABSTRACT

The present disclosure provides a wireless flexible magnetic sensor based on magnetothermal effect, and a preparation method and a detection method thereof. The magnetic sensor includes an aerogel substrate, and magnetic nanoparticles having magnetothermal effect that are attached to a surface of the aerogel substrate. The magnetic sensor is placed in the alternating magnetic field to be measured, and then a trigger signal is generated by a data collecting device and sent to an infrared camera. The infrared camera can collect temperature distribution information at different instants of time from the surface of the magnetic sensor. A curve of temperature rise changes at different positions on the surface of the magnetic sensor can be obtained by analyzing a temperature distribution image captured by the infrared camera. Thus, a spatial distribution of the strength of the alternating magnetic field at different positions on the surface of the sensor can be determined.

8 Claims, 4 Drawing Sheets

WIRELESS FLEXIBLE MAGNETIC SENSOR BASED ON MAGNETOTHERMAL EFFECT, AND PREPARATION METHOD AND DETECTION METHOD THEREOF

CROSS REFERENCE TO RELATED APPLICATION

This patent application claims the benefit and priority of Chinese Patent Application No. 202110101732.X filed on Jan. 26, 2021 and entitled "WIRELESS FLEXIBLE MAGNETIC SENSOR BASED ON MAGNETOTHERMAL EFFECT, AND PREPARATION METHOD AND DETECTION METHOD THEREOF", the disclosure of which is incorporated by reference herein in its entirety as part of the present application.

TECHNICAL FIELD

The present disclosure relates to the field of development of magnetic sensors, and in particular, to a wireless flexible magnetic sensor based on magnetothermal effect, and a preparation method and a detection method thereof.

BACKGROUND ART

Magnetic field is an important physical parameter. With the development of modern technology, electromagnetic fields have long been used in national defense security, electronic communications, television broadcasting, positioning and navigation, household appliances, etc. In terms of scientific research, apparatuses such as positive and negative ion colliders, mass spectrometers and Tokamaks that use electromagnetic fields have a profound impact on the development of society. As a special electromagnetic field form under extreme conditions, a strong magnetic field can transfer high-intensity energy to a material on the atomic scale without contact to change the arrangement, matching and migration behaviors of atoms and molecules, thereby affecting the microstructure and performance of the material. Treatment with strong magnetic field has become an important technical means for the development of new materials. At present, strong magnetic field material science, as a new interdisciplinary subject, has attracted extensive attention all over the world. Strong magnetic fields can be widely used in the preparation of superconducting materials and anisotropic magnetic materials, purification of metal materials, etc. In addition to strong magnetic fields, high-frequency electromagnetic fields also have a wide range of industrial applications, including high-frequency electromagnetic induction heating, high-frequency medium heating, radio communications, radio and television, radio knife in medical science. Therefore, it is necessary to detect strong magnetic fields and high-frequency electromagnetic fields, With the development of modern electromagnetics, magnetic sensors are also developed rapidly, which play an extremely important role in the fields of national economy, science and technology, military science, medical science, and so forth.

Magnetism is a remarkable characteristic of magnetic particles. When the magnetic particles have a single-domain size, the coercive force will exhibit a maximum value, and the magnetic particles become superparamagnetic. The use of the magnetism can be achieved through the conversion between magnetism and force and between magnetism and thermal energy. Ultrafine magnetic nanoparticles will undergo relaxation under the action of an alternating magnetic field, and the heat generated is directly related to the strength of the alternating magnetic field if the frequency of the magnetic field is known. The higher the strength of the alternating magnetic field, the more the heat generated during unit time due to the relaxation of the magnetic particles and the higher the temperature rise rate. Therefore, the strength of the alternating magnetic field can be measured by measuring the temperature rise rate of the magnetic particles under the action of the alternating magnetic field.

Infrared detection is an emerging, non-contact and non-destructive detection technology, which is real-time, accurate, fast, and highly sensitive. In infrared detection, infrared rays emitted by the detected object are received by an infrared camera, and the temperature distribution is displayed as image data, such that the temperature distribution and changes of the surface of the detected object can be determined accurately. The infrared camera can detect the subtle thermal state changes of the surface of the object and thus can accurately detect the temperature changes of magnetic particles on the surface of a sensor.

In view of this, the present disclosure proposes a wireless flexible magnetic sensor based on—magnetothermal effect and a spatial magnetic field detection method, which can realize wireless, flexible, high-resolution, non-contact quantitative detection of the spatial—distribution of the strength of an alternating magnetic field.

SUMMARY

To achieve the objective of detecting the spatial distribution of the strength of an alternating magnetic field, the present disclosure is aimed to provide a wireless flexible magnetic sensor based on magnetothermal effect, and a preparation method and a detection method thereof. The present disclosure provides a reliable method for measuring the spatial distribution of the strength of an alternating magnetic field. The magnetic sensor is wireless, flexible, high in spatial resolution, and large in detection range without contact, which fills the gap in this field all over the world at present and can be widely used in the detection of the spatial distribution of the strength of an alternating magnetic field, especially the high frequency and strong alternating magnetic field.

To achieve the objective, the present disclosure adopts the following technical solutions.

A wireless flexible magnetic sensor based on magnetothermal effect includes an aerogel substrate, and magnetic nanoparticles having magnetothermal effect that are attached to a surface of the aerogel substrate, where the aerogel substrate is highly flexible to adapt to a complex curved surface structure, has low thermal conductivity in a range of 0.020 to 0.026 W/(m·K) and is able to withstand a temperature of 300° C. maximally, and the aerogel has optimal formability;

when the magnetic nanoparticles used in the sensor are placed in an alternating magnetic field, relaxation occurs; the relaxation of the ultrafine magnetic nanoparticles in the alternating magnetic field result from Néel relaxation, and heat generated by a single magnetic nanoparticle due to Néel relaxation and dissipation is expressed as:

$$P = \frac{(mH\omega\tau)^2}{2kT\rho k(1+\omega^2\tau^2)} \quad (1)$$

where m represents a magnetic moment of the magnetic nanoparticle, while H a magnetic field strength, ω an angular frequency of an excitation signal, k the Boltzmann constant, T an ambient temperature, ρ a magnetic nanoparticle density, V a magnetic nanoparticle volume, and τ Néel relaxation time;

the Néel relaxation time τ in Formula (1) is expressed as:

$$\tau = \tau_0 e^{\frac{KV}{kT}}; \quad (2)$$

where $\tau_0$ represents a time constant which is $10^{-9}$ s, while K an anisotropy constant, V a magnetic nanoparticle volume, k the Boltzmann constant, and T an ambient temperature;

the magnetic nanoparticles generate heat due to the relaxation under the action of the alternating magnetic field, causing the temperature to rise; the generated heat is related to both magnetic field strength and magnetic field frequency, and in case of a given magnetic field frequency, Néel relaxation heat is merely related to a magnetic field strength; and a higher magnetic field strength leads to more heat generated due to the relaxation of the magnetic nanoparticles and a higher temperature rise rate of the sensor.

The magnetic nanoparticles may be ferroferric oxide nanoparticles.

A preparation method of the wireless flexible magnetic sensor based on magnetothermal effect includes the following specific steps:

producing polydimethylsiloxane (PDMS) silicone elastomer having the same size as the aerogel substrate and grooving the PDMS silicone elastomer by using a laser cutter; bonding the PDMS silicone elastomer to the aerogel substrate and filling PDMS silicone elastomer grooves with the magnetic nanoparticles having magnetothermal effect; and finally removing the PDMS silicone elastomer from the aerogel substrate to obtain the wireless flexible magnetic sensor based on magnetothermal effect.

A detection method for a spatial magnetic field distribution with the wireless flexible magnetic sensor based on magnetothermal effect includes the following specific steps:

step 1: setting up a sensor detection system, which specifically includes:

using a data collecting device, the magnetic sensor and an infrared camera to set up the sensor detection system, where the data collecting device is connected to the infrared camera and transmits a trigger signal to the infrared camera; placing the magnetic sensor in an alternating magnetic field to he measured, and fixing the infrared camera above the magnetic sensor, the infrared camera capturing an image after receiving the trigger signal from the data collecting device and transmitting the image to the data collecting device; and step 2: measuring the alternating magnetic field by using the magnetic sensor, which specifically includes:

placing the wireless flexible magnetic sensor based on magnetothermal effect in the magnetic field to be measured, setting relevant collection parameters including a sampling frequency and total sampling time for the infrared camera, and transmitting the trigger signal to the infrared camera, allowing the infrared camera to collect a signal;

where temperature distribution information of the surface of the magnetic sensor at different instants of time is collected by the infrared camera and curves of temperature rise changes at different positions on the surface of the magnetic sensor is obtained by analyzing temperature distribution images captured by the infrared camera; the magnetic nanoparticles on the surface of the magnetic sensor generate heat due to relaxation under the action of the alternating magnetic field, causing the temperature to rise; the heat generated by the magnetic nanoparticles under the action of the alternating magnetic field is directly related to a magnetic field strength; a higher magnetic field strength leads to more heat generated due to the relaxation of the magnetic nanoparticles and a higher temperature rise rate of the sensor; and then a spatial distribution of the strength of the alternating magnetic field at different positions on the surface of the sensor is determined according to the temperature rise rates of different sensing units on the surface of the sensor.

The detection method for a spatial distribution of the strength of magnetic field is suitable for detection of an alternating magnetic field because the magnetic nanoparticles do not generate heat in a static magnetic field.

Compared with the prior art, the present disclosure has the following advantages:

1) A wireless flexible magnetic sensor based on magnetothermal effect is proposed for the first time. Magnetic nanoparticles are used to make a magnetic sensor. Compared with traditional sensors, the magnetic sensor is flexible, adaptable to complex detection surfaces, high in spatial resolution, etc., and can conveniently measure the spatial distribution of the strength of a magnetic field.

2) The present disclosure uses an infrared camera to measure the temperature rise of magnetic nanoparticles, which has the characteristics of high efficiency, non-contact and large detection range, and has promising application prospects.

DETAILED DESCRIPTION OF THE EMBODIMENTS

Figure 1:
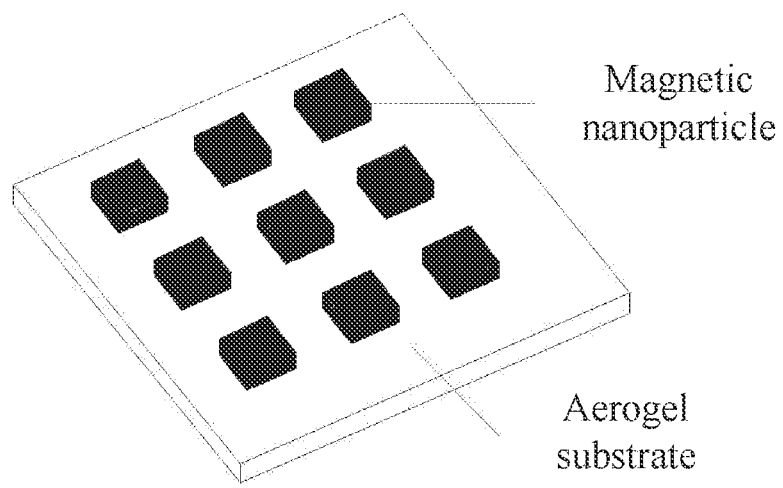
FIG. 1 is a top view of a magnetic sensor according to the present disclosure.
Figure 4:
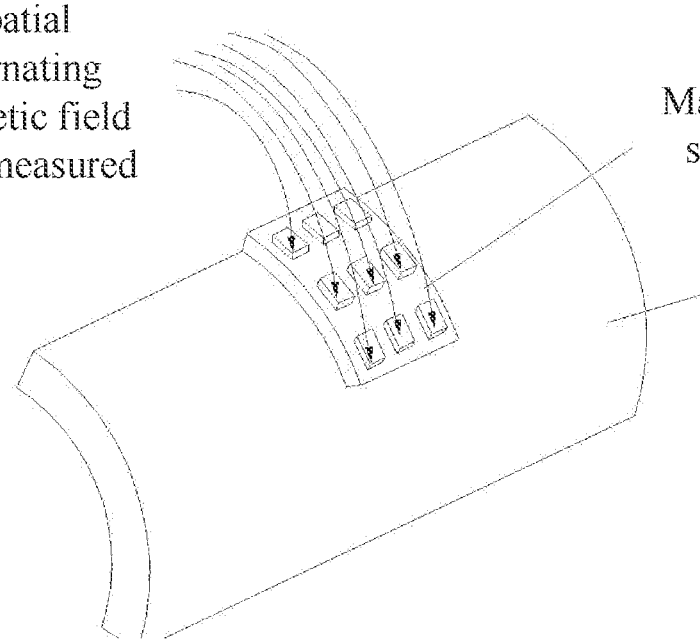
FIG. 4 is a diagram illustrating an application scenario according to the present disclosure.
Figure 6:
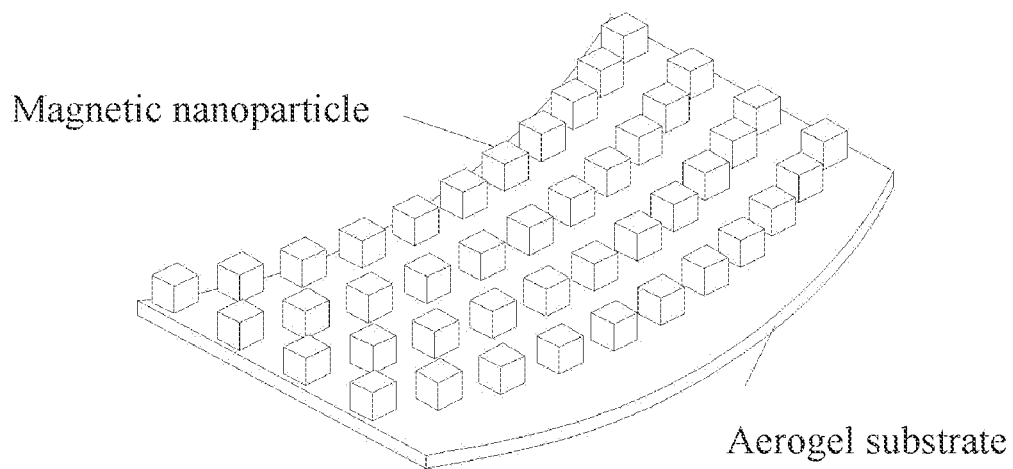
FIG. 6 is a stereoscopic view of a magnetic sensor according to the present disclosure.

As shown in FIG. 1 and FIG. 6, a wireless flexible magnetic sensor based on magnetothermal effect proposed in the present disclosure is simple in structure, only an aerogel substrate and sensing unit made of magnetic nanoparticles included. The aerogel substrate is flexible. As shown in FIG. 4, the wireless flexible magnetic sensor based on magnetothermal effect proposed in the present disclosure is adaptable to complex curved surfaces.

The present disclosure is further described below in combination with FIG. 2 and FIG. 3 and specific embodiments.

Figure 2:
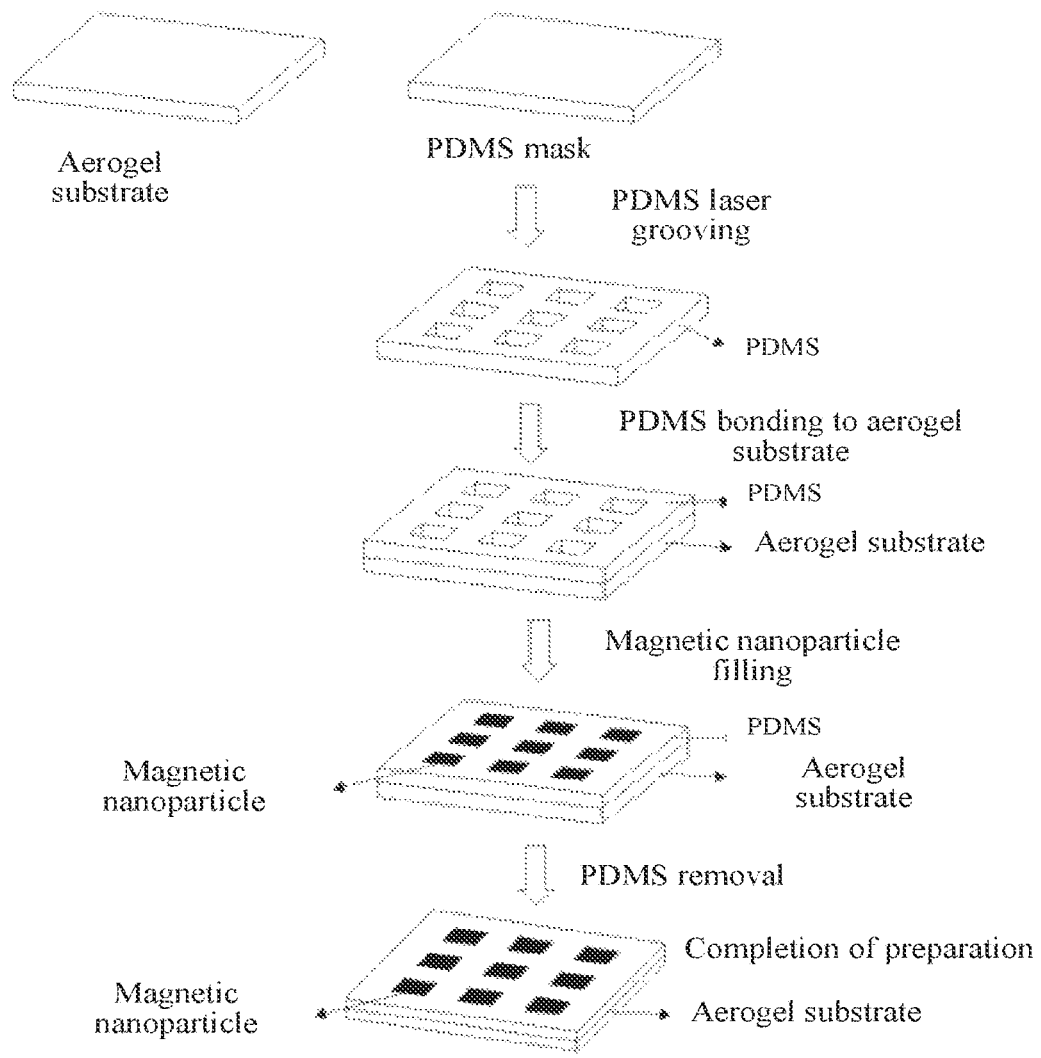
FIG. 2 is a flowchart diagram of a preparation method of a magnetic sensor according to the present disclosure.

As shown in FIG. 2, a preparation method of the wireless flexible magnetic sensor based on magnetothermal effect shown in FIG. 1 and FIG. 6 includes the following specific steps:

produce polydimethylsiloxane (PDMS) silicone elastomer having the same size as the aerogel substrate having a thickness of 5 mm and groove the PDMS silicone elastomer by using a laser cutter; bond the PDMS silicone elastomer to the aerogel substrate and fill PDMS silicone elastomer grooves with 20 nm $Fe_3O_4$ having magnetothermal effect; and finally remove the PDMS silicone elastomer from the aerogel substrate to obtain the wireless flexible sensor based on magnetothermal effect.

Figure 3:
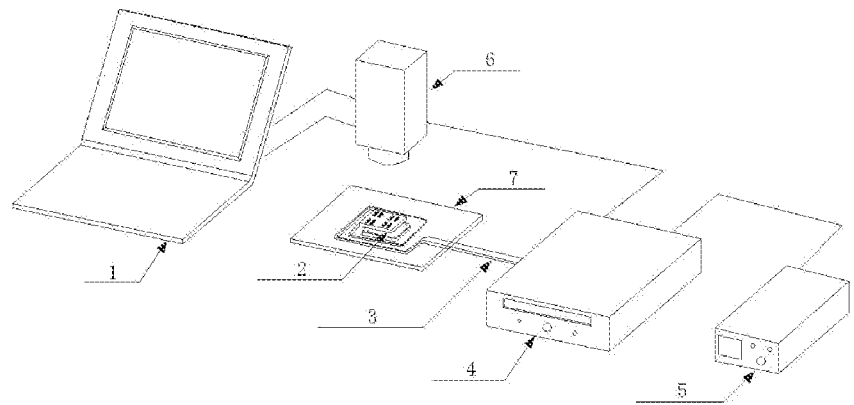
FIG. 3 is a schematic diagram of an experimental verification system for a magnetic sensor according to the present disclosure.

A detection method for a spatial magnetic field distribution with the wireless flexible magnetic sensor based on magnetothermal effect provided in the present disclosure includes the following steps:

Step 1: a sensor verification experiment system is set up. The specific steps are as follows:

As shown in FIG. 3, firstly, the sensor detection system is set up, which includes a magnetic sensor 2, an infrared camera 6, and a data collecting device 1. Then, to provide a spatial magnetic field with a known frequency and magnetic field distribution, an excitation coil 3, a heater 4, and a cooler 5 are added. A perspex sheet 7 is used to stably place the magnetic sensor in the known magnetic field. The data collecting device 1 is connected to the infrared. camera 6, and synchronizes a trigger signal to the heater 4 and the infrared camera 6. The infrared camera 6 is fixed above the magnetic sensor 2, captures an image after receiving the trigger signal from the data collecting device 1 and transmits the image to the data collecting device 1. The magnetic sensor 2 is placed above the excitation coil 3 where the magnetic field is to be measured, and the perspex sheet 7 is placed between the excitation coil 3 and the magnetic sensor 2. The heater 4 applies a pulsed excitation current to the excitation coil 3, so that the excitation coil generates an alternating magnetic field. The cooler 5 is connected to the heater 4 to cool the excitation coil 3 connected to the heater 4.

Step 2: the alternating magnetic field is measured by using the magnetic sensor 2. The specific steps are as follows:

Firstly, the excitation coil 3 is selected. In the embodiment, a multi-turn coil is selected. The wireless flexible magnetic sensor 2 based on magnetocaloric effect is placed at the magnetic field to be measured. In the embodiment, the magnetic sensor 2 is placed in the center of the excitation coil 3, and the perspex sheet 7 is arranged under the magnetic sensor 2, with an air gap between the perspex sheet 7 and the coil 3, Then, the temperature of the infrared camera 6 is calibrated, and after calibration, focusing is performed to ensure that the image of the magnetic sensor 2 in the infrared camera 6 is clear. Meanwhile, the distance between the infrared camera 6 and the excitation coil 3 must be greater than 500 mm to prevent the magnetic field generated by the excitation coil from affecting the performance of the infrared camera. Secondly, the pulse excitation current related parameters of the heater 4 are set in the data collecting device 1: a pulse excitation current of 350 A, an excitation frequency of 325 kHz, and excitation time of 400 s. Relevant collection parameters of the infrared camera 6 are set in the data collecting device 1: a sampling frequency of 20 Hz and total sampling time of 450 s. Subsequently, the data collecting device 1 synchronizes the trigger signal to the heater 4 and the infrared camera 6, and the cooler 5 is connected to the heater 4 to cool the excitation coil 3. After receiving the trigger signal, the heater device 4 applies a pulsed excitation current to the excitation coil 3 to form an alternating magnetic field in the space around the magnetic sensor 2.

The magnetic nanoparticles used in the magnetic sensor are ultrafine magnetic nanoparticles, which will under relaxation in an alternating magnetic field. The relaxation of the ultrafine magnetic nanoparticles in the alternating magnetic field result from Néel relaxation, and heat generated by a single magnetic nanoparticle due to Néel relaxation is expressed as:

$$P = \frac{(mH\omega\tau)^2}{2kT\rho k(1+\omega^2\tau^2)} \quad (1)$$

where in represents a magnetic moment of the magnetic nanoparticle, while H a magnetic field strength, ω angular frequency of an excitation signal, k the Boltzmann constant, T an ambient temperature, ρ a magnetic nanoparticle density, V a magnetic nanoparticle volume, and τ Néel relaxation time;

The Néel relaxation time in Formula (1) is expressed as:

$$\tau = \tau_0 e^{\frac{KV}{kT}}; \quad (2)$$

where $\tau_0$ represents a time constant which is $10^{-9}$ s, while K an anisotropy constant, V a magnetic nanoparticle volume, k the Boltzmann constant, and T an ambient temperature.

Figure 5:
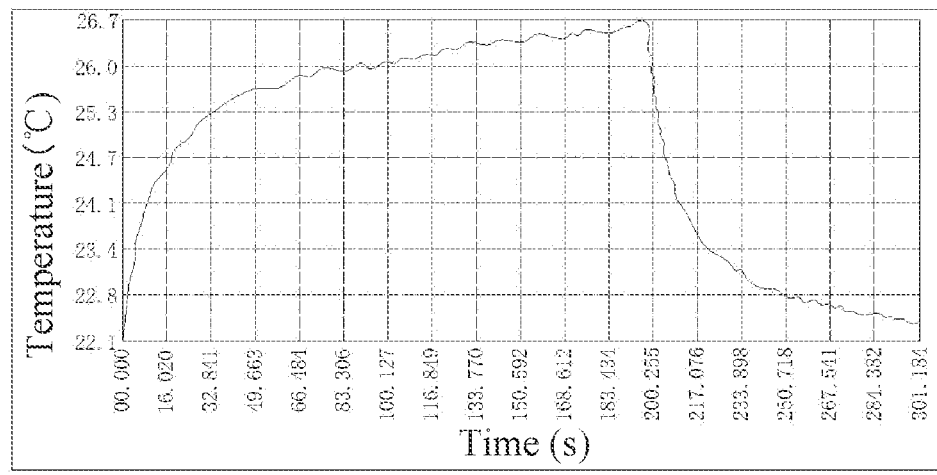
FIG. 5 is a chart showing a temperature rise curve of magnetic particles in an alternating magnetic field according to the present disclosure.

The magnetic nanoparticles generate heat due to relaxation under the action of the alternating magnetic field, causing the temperature to rise. The heat generated by the magnetic nanoparticles under the action of the alternating magnetic field is directly related to a magnetic field strength. A higher magnetic field strength leads to more heat generated due to the relaxation of the magnetic particles and a higher temperature rise rate of the magnetic sensor. When receiving the trigger signal from the data collecting device 1, the infrared camera 6 collects temperature changes of the magnetic particles in the sensor 2. As shown in FIG. 5, the temperature rises by 4.6° C. in 200 s within the region of the magnetic particles in this embodiment. The spatial distribution of the strength of the alternating magnetic field is evaluated by analyzing a sequence of images captured by the infrared camera 6.

What is claimed is:

1. A wireless flexible magnetic sensor based on magnetothermal effect, comprising an aerogel substrate, and magnetic nanoparticles having magnetothermal effect that are attached to a surface of the aerogel substrate, wherein the magnetic nanoparticles are configured as array structures;

wherein the aerogel substrate is highly flexible to adapt to a complex curved surface structure, has low thermal conductivity in a range of 0.020 to 0.026 W/(m·K) and thus is able to withstand a temperature of 300° C. maximally, and the aerogel has optimal formability;

when the magnetic nanoparticles used in the sensor are placed in an alternating magnetic field, relaxation occurs; the relaxation of the magnetic nanoparticles in the alternating magnetic field result from Néel relaxation, and heat generated by a single magnetic nanoparticle due to Néel relaxation and dissipation is expressed as:

$$P = \frac{(mH\omega\tau)^2}{2kT\rho k(1+\omega^2\tau^2)} \quad (1)$$

wherein m represents a magnetic moment of the magnetic nanoparticle, while H a magnetic field strength, ω an angular frequency of an excitation signal, k the Boltzmann constant, T an ambient temperature, ρ a magnetic nanoparticle density, V a magnetic nanoparticle volume, and τ Néel relaxation time;

the Néel relaxation time τ in Formula (1) is expressed as:

$$\tau = \tau_0 e^{\frac{KV}{kT}}; \qquad (2)$$

wherein $\tau^0$ represents a time constant which is $10^{-9}$ s, while K an anisotropy constant, V a magnetic nanoparticle volume, k the Boltzmann constant, and T an ambient temperature;

the magnetic nanoparticles generate heat due to the relaxation under the action of the alternating magnetic field, causing the temperature to rise; the generated heat is related to both magnetic field strength and magnetic field frequency, and in case of a given magnetic field frequency, Néel relaxation heat is merely related to a magnetic field strength; and a higher magnetic field strength leads to more heat generated due to the relaxation of the magnetic nanoparticles and a higher temperature rise rate of the sensor.

2. The wireless flexible magnetic sensor based on magnetothermal effect according to claim 1, wherein the magnetic nanoparticles are ferroferric oxide nanoparticles.

3. A preparation method of the wireless flexible magnetic sensor based on magnetothermal effect according to claim 2, comprising the following specific steps:

producing polydimethylsiloxane (PDMS) silicone elastomer having the same size as the aerogel substrate and grooving the PDMS silicone elastomer by using a laser cutter; bonding the PDMS silicone elastomer to the aerogel substrate and filling PDMS silicone elastomer grooves with the magnetic nanoparticles having magnetothermal effect; and finally removing the PDMS silicone elastomer from the aerogel substrate to obtain the wireless flexible magnetic sensor based on magnetothermal effect.

4. A detection method for a spatial magnetic field distribution with the wireless flexible magnetic sensor based on magnetothermal effect according to claim 2, comprising the following specific steps:

step 1: setting up a sensor detection system, which specifically comprises:

using a data collecting device, the magnetic sensor and an infrared camera to set up the sensor detection system, wherein the data collecting device is connected to the infrared camera and transmits a trigger signal to the infrared camera; placing the magnetic sensor in an alternating magnetic field to be measured, and fixing the infrared camera above the magnetic sensor, the infrared camera capturing an image after receiving the trigger signal from the data collecting device and transmitting the image to the data collecting device; and step 2: measuring the alternating magnetic field by using the magnetic sensor, which specifically comprises:

placing the wireless flexible magnetic sensor based on magnetothermal effect in the magnetic field to be measured, setting relevant collection parameters including a sampling frequency and total sampling time for the infrared camera, and transmitting the trigger signal to the infrared camera, allowing the infrared camera to collect a signal;

wherein temperature distribution information at different instants of time is collected by the infrared camera from the surface of the magnetic sensor, and a curve of temperature rise changes at different positions on the surface of the magnetic sensor is obtained by analyzing a temperature distribution image captured by the infrared camera; the magnetic nanoparticles on the surface of the magnetic sensor generate heat due to relaxation and dissipation under the action of the alternating magnetic field, causing the temperature to rise; the heat generated by the magnetic nanoparticles under the action of the alternating magnetic field is directly related to a magnetic field strength; a higher magnetic field strength leads to more heat generated due to the relaxation of the magnetic nanoparticles and a higher temperature rise rate of the sensor; and then a spatial distribution of the strength of the alternating magnetic field at different positions on the surface of the sensor is determined according to the temperature rise rate on the surface of the sensor.

5. The detection method for a spatial magnetic field distribution according to claim 4, which is suitable for detection of an alternating magnetic field because the magnetic nanoparticles do not generate heat in a static magnetic field.

6. A preparation method of the wireless flexible magnetic sensor based on magnetothermal effect according to claim 1, comprising the following specific steps:

producing polydimethylsiloxane (PDMS) silicone elastomer having the same size as the aerogel substrate and grooving the PDMS silicone elastomer by using a laser cutter; bonding the PDMS silicone elastomer to the aerogel substrate and filling PDMS silicone elastomer grooves with the magnetic nanoparticles having magnetothermal effect; and finally removing the PDMS silicone elastomer from the aerogel substrate to obtain the wireless flexible magnetic sensor based on magnetothermal effect.

7. A detection method for a spatial magnetic field distribution with the wireless flexible magnetic sensor based on magnetothermal effect according to claim 1, comprising the following specific steps:

step 1: setting up a sensor detection system, which specifically comprises:

using a data collecting device, the magnetic sensor and an infrared camera to set up the sensor detection system, wherein the data collecting device is connected to the infrared camera and transmits a trigger signal to the infrared camera; placing the magnetic sensor in an alternating magnetic field to be measured, and fixing the infrared camera above the magnetic sensor, the infrared camera capturing an image after receiving the trigger signal from the data collecting device and transmitting the image to the data collecting device; and step 2: measuring the alternating magnetic field by using the magnetic sensor, which specifically comprises:

placing the wireless flexible magnetic sensor based on magnetothermal effect in the magnetic field to be measured, setting relevant collection parameters including a sampling frequency and total sampling time for the infrared camera, and transmitting the trigger signal to the infrared camera, allowing the infrared camera to collect a signal;

wherein temperature distribution information at different instants of time is collected by the infrared camera from the surface of the magnetic sensor, and a curve of temperature rise changes at different positions on the surface of the magnetic sensor is obtained by analyzing a temperature distribution image captured by the infrared camera; the magnetic nanoparticles on the surface of the magnetic sensor generate heat due to relaxation and dissipation under the action of the alternating magnetic field, causing the temperature to rise; the heat generated by the magnetic nanoparticles under the action of the alternating magnetic field is directly related to a magnetic field strength; a higher magnetic field strength leads to more heat generated due to the relaxation of the magnetic nanoparticles and a higher temperature rise rate of the sensor; and then a spatial distribution of the strength of the alternating magnetic field at different positions on the surface of the sensor is determined according to the temperature rise rate on the surface of the sensor.

8. The detection method for a spatial magnetic field distribution according to claim 7, which is suitable for detection of an alternating magnetic field because the magnetic nanoparticles do not generate heat in a static magnetic field.

* * * * *